United States Patent
Speh et al.

(10) Patent No.: US 6,799,588 B1
(45) Date of Patent: Oct. 5, 2004

(54) APPARATUS FOR TREATING SUBSTRATES

(75) Inventors: Ulrich Speh, Steinenbronn (DE); Jens Schneider, Reutlingen (DE); Marc Meuris, Keerbergen (BE)

(73) Assignee: STEAG Microtech GmbH (DE)

( * ) Notice: Subject to any disclaimer, the term of this patent is extended or adjusted under 35 U.S.C. 154(b) by 239 days.

(21) Appl. No.: 10/031,923

(22) PCT Filed: Jul. 14, 2000

(86) PCT No.: PCT/EP00/06716

§ 371 (c)(1),
(2), (4) Date: Apr. 17, 2002

(87) PCT Pub. No.: WO01/08200

PCT Pub. Date: Feb. 1, 2001

(30) Foreign Application Priority Data

Jul. 21, 1999 (DE) ......................................... 199 34 300

(51) Int. Cl.⁷ ................................................ B08B 3/04
(52) U.S. Cl. ............................... 134/64 R; 134/104.2; 134/122 R; 134/184; 134/186; 134/902
(58) Field of Search .......................... 134/64 R, 122 R, 134/104.2, 184, 186, 155, 133, 902

(56) References Cited

U.S. PATENT DOCUMENTS

| | | | | |
|---|---|---|---|---|
| 3,650,042 A | * | 3/1972 | Boerger et al. ............... | 34/611 |
| 4,282,825 A | * | 8/1981 | Nagatomo et al. ............ | 118/58 |
| 4,458,703 A | * | 7/1984 | Inoue et al. ............... | 134/57 R |
| 4,475,259 A | * | 10/1984 | Ishii et al. ..................... | 15/102 |
| 4,557,785 A | * | 12/1985 | Ohkuma ................ | 156/345.18 |
| 4,589,926 A | * | 5/1986 | Holmstrand .................... | 134/6 |
| 4,722,355 A | * | 2/1988 | Moe et al. ..................... | 134/73 |
| 4,724,856 A | * | 2/1988 | Pender .................... | 134/122 R |
| 5,007,445 A | * | 4/1991 | Pender .................... | 134/122 R |
| 5,203,798 A | * | 4/1993 | Watanabe et al. ........... | 134/184 |
| 5,333,628 A | * | 8/1994 | Ogata et al. ............... | 134/64 R |
| 5,335,681 A | * | 8/1994 | Schmid .................... | 134/64 R |
| 5,503,171 A | | 4/1996 | Yokomizo et al. | |
| 5,766,685 A | * | 6/1998 | Smith et al. ................. | 427/307 |
| 5,836,325 A | * | 11/1998 | Akanuma et al. ........... | 134/183 |
| 6,058,950 A | * | 5/2000 | Fujii et al. ................... | 134/182 |
| 6,077,359 A | * | 6/2000 | Baron et al. .................... | 134/2 |
| 6,247,481 B1 | * | 6/2001 | Meuris et al. ............... | 134/133 |
| 6,412,500 B1 | * | 7/2002 | Brunner et al. ........... | 134/64 R |
| 6,423,149 B1 | * | 7/2002 | Crevasse et al. ................ | 134/6 |
| 6,506,260 B1 | * | 1/2003 | Hiraishi et al. ............... | 134/15 |
| 6,530,385 B2 | * | 3/2003 | Meuris et al. ............. | 134/25.4 |
| 6,621,377 B2 | * | 9/2003 | Osadchy et al. ............ | 333/161 |

FOREIGN PATENT DOCUMENTS

| | | | |
|---|---|---|---|
| DE | 19616400 | | 11/1997 |
| EP | 0817246 A1 | | 1/1998 |
| JP | 3-94428 | * | 4/1991 |
| JP | 5-182945 | * | 7/1993 |

OTHER PUBLICATIONS

JP 5–291223, Water Cleaning Apparatus.
JP 06005577, Substrate Cleaning Device.
JP 03020031, Ultrasonic Cleaning Device.
JP 6–73598, Method fro Producing Semi–conductor and Device Thereof.

(List continued on next page.)

Primary Examiner—Frankie L. Stinson
(74) Attorney, Agent, or Firm—R W Becker & Associates; R W Becker

(57) ABSTRACT

The aim of the invention is to attain a uniform and homogeneous treatment of substrates in a device comprising at least one process container which is arranged in a gas atmosphere and which contains a treatment fluid. Said process container also comprises at least two openings which are located underneath a treatment fluid surface and through which the substrates are linearly guided. In addition, an overflow for the treatment fluid is provided.

13 Claims, 2 Drawing Sheets

OTHER PUBLICATIONS

JP 6–244164 (1), Ultrasonic Cleaning Device.
JP 10308376 (A) Cleaning of Wafer and Wafer Cleaning Device.
JP 62–279640, Wafer Washing Apparatus.
JP 5–166793 (A) Dipping Type Substrate Treatment Apparatus.
JP 10163158 A Cleaning Apparatus for Sheetlike Body.
JP 10163164 A Substrate Treatment Method and Substrate Treatment Apparatus.
JP 07066100 A Air Knife and Processor Using the Same.
JP 4–10416 (A) Method and Apparatus for Drying Substrate.
JP 06326067 A Substrate Treatment Apparatus.

* cited by examiner

APPARATUS FOR TREATING SUBSTRATES

BACKGROUND OF THE INVENTION

The present invention relates to an apparatus for treating substrates, and includes at least one process container that is disposed in a gas atmosphere, contains a treatment fluid, and has at least two continuously open openings that are disposed below a treatment fluid surface and are provided for the linear guidance of the substrates through the container.

Such an apparatus, which is known, for example, from EP-A-0 817 246, is a static system with which the treatment fluid stands in the process container without moving. The result of this is that a process taking place in the container is adversely affected by contamination of the treatment fluid, especially in the region of the linear guidance of the substrates through the container. Thus, it is not possible to have a good and homogeneous treatment of the substrates.

Furthermore known from JP-A-5-291 223 is an apparatus for the treatment of substrates according to which a process container that can be filled with treatment fluid from above is provided with two lateral openings. The openings can be respectively closed off by closure elements in order during the treatment to prevent an escape of treatment fluid. Provided on the base of the process container is an outlet for the treatment fluid.

Proceeding from the above mentioned state of the art it is therefore an object of the present invention to provide an apparatus of the aforementioned general type that in a simple and economical manner enables a more homogeneous and improved treatment of substrates.

SUMMARY OF THE INVENTION

Pursuant to the present invention, the object is realized, for an apparatus for treating substrates having at least one process container that is disposed in a gas atmosphere, contains a treatment fluid and has at least two openings disposed below a treatment fluid surface for the linear guidance of the substrates therethrough, by an overflow means for the treatment fluid. The overflow means for the treatment fluid enables a continuous conveyance of treatment fluid through the process container. This prevents increased concentrations of contamination in certain regions of the process container, especially in the region of the linear guidance of the substrates, or changes in concentration of the cleaning media (consumption during the cleaning) are again compensated for. This ensures an improved and more homogeneous treatment of the substrates. Furthermore, by providing an overflow means, an essentially uniform treatment fluid level is ensured during the treatment in a simple and economical manner, and thus a more uniform pressure of the treatment fluid is ensured at the openings. Despite a flow of the treatment fluid, a uniform pressure can in a simple manner prevent the treatment fluid from flowing out of the process container.

Pursuant to one particularly preferred embodiment of the invention, the height of the overflow means can be adjusted in order to vary the treatment fluid level within the process container. This is particularly advantageous if within the process container treatments are carried out with different treatment fluids that have different densities, and, at the same fluid level, different pressure conditions would result at the openings that are disposed below the treatment fluid surface. These pressure conditions can be set via the height-adjustable overflow means in order to prevent the treatment fluid from flowing out of the openings.

A closed overflow container is preferably provided in order to enable a vacuum to be applied in an air space that is formed above the treatment fluid surface. By means of the vacuum an under pressure can be generated at the openings that are disposed below the treatment fluid surface in order to prevent the treatment fluid from flowing out. Especially in combination with the height-adjustable overflow edge, a simple control of the pressure conditions at the openings can be achieved. In the air space that is located above the treatment fluid a uniform vacuum is preferably provided. The pressure changes that result, for example, due to different treatment fluids (due to different densities) at the openings are preferably regulated by the height-adjustable overflow edge. To enable a good and uniform vacuum, the process container and the overflow container are closed off.

For a uniform and homogeneous flow within the process container, the treatment fluid can preferably be introduced into the process container via an essentially horizontally disposed diffuser plate. Pursuant to a further embodiment of the invention, a collecting trough is mounted on the outer periphery of the process container below at least one of the openings in order to prevent any treatment fluid that might escape from the process container from contaminating the area around the process container.

Pursuant to one preferred embodiment of the invention, at least one ultrasonic unit is provided within the process container in order by causing ultra-sound waves to act on the substrates to promote the treatment thereof, and in particular cleaning processes. In this connection the ultrasonic unit preferably extends over the entire width of the process container, and in particular perpendicular to the direction of movement of the substrates, and is also pivotable in order to provide a uniform impingement of ultra-sound waves over the entire surface of the substrates. To enable a uniform and homogeneous flow of the treatment fluid within the process container, the ultrasonic unit preferably has an aerodynamic shape, i.e. it has little resistance to flow in the direction of flow. For a good and uniform treatment of both surfaces of the substrate, it is preferably movable between at least two ultrasonic units.

Pursuant to a further embodiment of the invention, a drying chamber is provided that surrounds an outlet opening of the process container and that has a device for the introduction of a fluid that reduces the surface tension of the treatment fluid. By providing the drying chamber at the outlet opening, the previously treated substrates can be dried via the Marangoni effect immediately upon removal from the process container. The chamber preferably forms an essentially closed system, as a result of which a uniform $N_2$/IPA atmosphere is ensured at the wafer exit.

Pursuant to a further, preferred embodiment of the invention, a plurality of process containers are disposed one after another. These containers make it possible for the substrates, without a necessary alteration of their orientation, to pass through a plurality of possibly different process steps. In this connection, the process containers preferably contain different treatment fluids in order to provide different process steps. A wetting unit is preferably provided between the process containers to prevent the substrates from drying out between the successive process steps, which could adversely affect successive process steps. The wetting unit is preferably designed in such a way that the substrates are initially rinsed, thereby preventing treatment fluid from passing from one process container to the next.

BRIEF DESCRIPTION OF THE DRAWINGS

The invention will be explained in greater detail subsequently with the aid of preferred exemplary embodiments and with reference to the figures. The drawings show.

DESCRIPTION OF THE PREFERRED EMBODIMENTS

Figure 1:
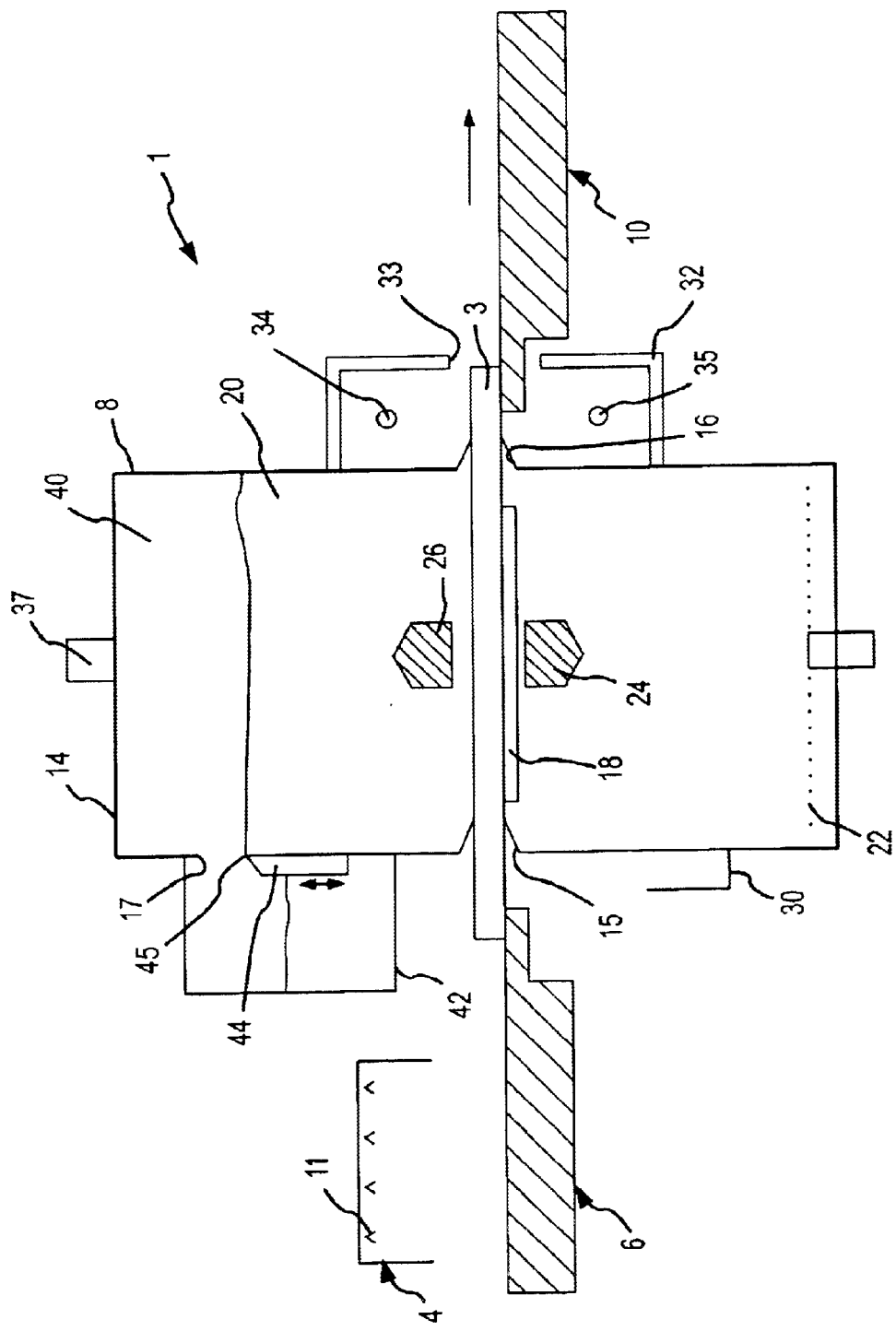
FIG. 1 a schematic cross-sectional view of one inventive treatment apparatus.

FIG. 1 shows a treatment apparatus 1 for a semiconductor wafer 3, with a wetting unit 4, a wafer transport unit 6, a process container 8 and a wafer transport unit 10. Pursuant to the figure, during a treatment of the substrate 3 it is moved from the left by the wafer transport unit 6 past the wetting unit 4 and is subsequently introduced into the process container 8, and is partially pushed therethrough. On the other side, the wafer 3 is received by the wafer transport unit 10 and is withdrawn from the process container 8. Details of the transport device are described in the patent application filed by the same applicant on the same day and having the title "Method and Apparatus for Transporting a Semiconductor Wafer through a Treatment Container"; to avoid repetition, such application is to this extent made the subject matter of the present invention.

The wetting unit 4 has a plurality of nozzles 11, via which a fluid, for example DI water, is sprayed onto at least one surface of the wafer 3 in order to moisten it, or in the event that it is already moist to keep it moist. Although not illustrated in the figure, the nozzles 11 can be directed counter to the direction of movement of the wafer 3 in order to achieve a rinsing of at least one surface of the wafer 3. In addition to the illustrated wetting unit 4, below which the wafer 3 is moved through, it is also possible to provide a second wetting unit that is disposed across from the wetting unit 4, so that the wafer 3 is moved through both wetting units and is thus moistened from both sides.

The process container 8 is formed by an essentially closed container body 14, which is provided with an introduction opening 15, and an outlet opening 16 as well as an overflow opening 17. The introduction opening 15 and the outlet opening 16 are disposed on a plane on oppositely disposed side walls of the container body 14. Further side walls of the container body 14, which are not provided with the openings 15, 16, are provided with guide bars or rails 18 for guiding the wafers 3 within the process container 8.

The openings 15, 16 are disposed beneath the overflow opening 17 and are thus disposed beneath a treatment fluid surface of a treatment fluid 20 that is located in the process container 8. The openings 15, 16 can have a special shape, as described, for example, in EP-A-0 817 246, in order to prevent an escape of the treatment fluid 20 that is in the process container 8. To this extent, to avoid repetition, EP-A-0 817 246 is made the subject matter of the present invention.

In the vicinity of the base of the process container 8, there is provided an essentially horizontally extending diffuser plate 22, via which the treatment fluid 20 is introduced from below into the process container 8. By means of the diffuser plate 22, a uniform upwardly directed flow of the treatment fluid 20 within the process container 8 is produced. Provided within the process container are two ultrasonic or megasonic units 24, 25 that extend over the entire width (pursuant to the figure perpendicular to the plane of the drawing). The ultrasonic units 24, 26 face one another and with regard to their level are disposed below and above the openings 15, 16 respectively, so that as the wafers 3 move through the process container they are moved through the ultrasonic units 24, 26. Those sides of the ultrasonic units 24, 26 that face away from one another are respectively beveled in order to have as little adverse effect as possible upon the fluid flow that is directed upwardly from below in the process container 8.

Provided on the outer periphery of the container body 14, in the region of the introduction opening 15 and below the opening 15, is a collecting trough 30 in order to catch any treatment fluid that escapes via the opening 15 and to convey it away in a suitable manner that is not illustrated in detail.

Figure 2:
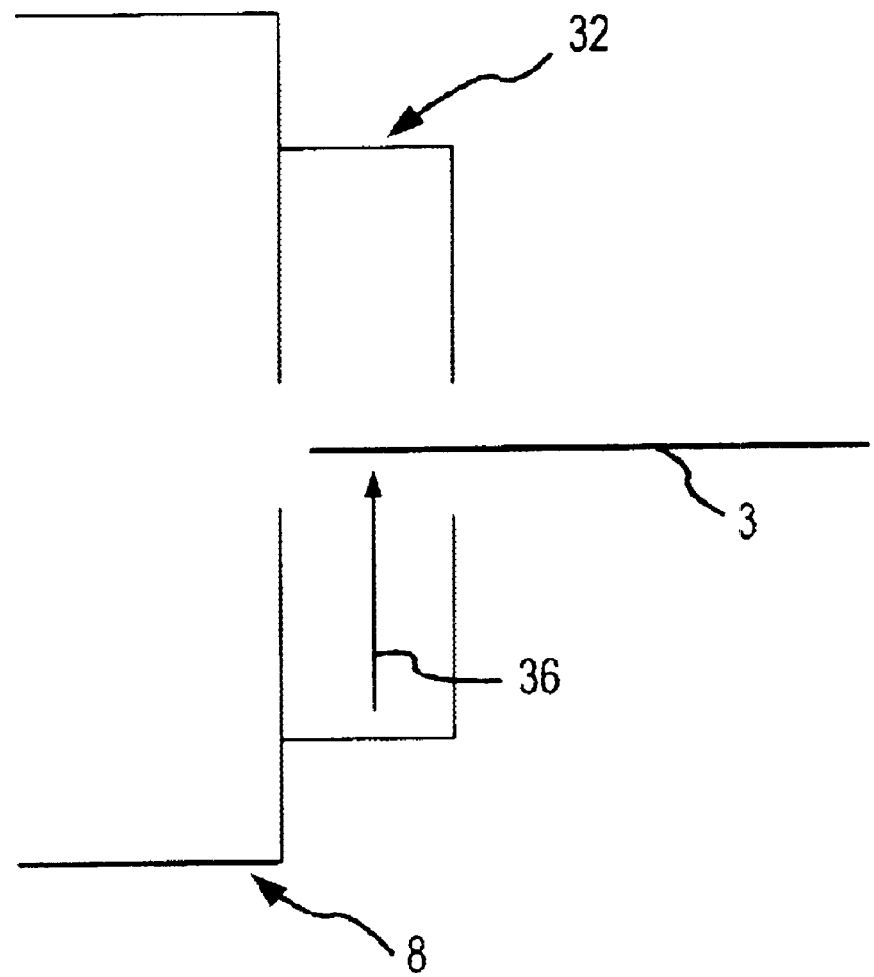
FIG. 2 an enlarged detailed view of a collecting trough of the treatment apparatus with a drip catcher.

The outlet opening 16 is surrounded by a drying chamber 32 that is mounted on the outer periphery of the container body 14 and has an integrated collecting trough. The drying chamber 32 has an opening 33 through which the wafer 3 can be moved. Provided within the drying chamber 32 are nozzles 34, 35 via which a fluid, which reduces the surface tension of the treatment fluid, can be introduced into the region of the outlet opening 16. A fluid that is suitable as a surface tension reducing fluid is, for example, IPA, a hot gas such as hot $N_2$, etc. The fluid that reduces the surface tension of the treatment fluid is directed via the nozzles 34, 35 in a precise manner upon a meniscus formed between the treatment fluid 20 and the wafer 3 in order at this location to achieve a good drying pursuant to the Marangoni principle. Alternatively, the meniscus could also be heated in some other way, for example with a laser, in order in this region to achieve a reduction of the surface tension. FIG. 2 shows an enlarged detailed view of the drying chamber 32, whereby for the sake of simplifying illustration the nozzles 34, 35 have been left out. As can be recognized from FIG. 2, provided in a lower half of the drying chamber 32 is a needle-shaped element 36 that serves as a drip catcher. At the rear edge of the wafer the drying process via the Marangoni effect during discharge from the chamber is critical, and it is possible for dense fluid to adhere to the wafer and to form a drop. This drop is, however, drawn off by the drip catcher 36, which is positioned at a slight distance, for example >1 millimeter, from the wafer and at the center thereof.

Provided in the upper wall of the container body 14 is a non-illustrated opening that is in communication with a vacuum device 37, so that an under pressure can be applied in an air space 40 that is formed above the treatment fluid 20 in order to prevent the treatment fluid from flowing out of the process container 8. Other means could also be provided on or in the process container 8 in order to prevent the treatment fluid form flowing out, such as described, for example, in EP-A-0 817 246, which in order to avoid repetition is to this extent made the subject matter of the present application.

The overflow opening 17 is surrounded by an essentially closed overflow container 42 that is secured in a sealed manner on the outer periphery of the container body 14. Provided within the overflow container 42, i.e. on an outer wall of the process container body 14, is a slide unit 44 that defines an overflow edge 45. The slide unit 44 can be displaced vertically by means of a non-illustrated device in order to set the height of the overflow edge 45 and hence to set the level of the treatment fluid 20 in the process container 8. In this connection, the setting range is limited by the upper and lower edges of the overflow opening 17.

Although only one process container 8 is illustrated in the figure, it is possible to dispose a plurality of process containers one after another, so that a wafer 3 can pass through a plurality of process containers during its linear path of movement. The respective process containers can be filled with different treatment fluids in order to carry out different treatment steps, such as, for example, etching, neutralization and cleaning, as well as drying. A wetting unit 4 is preferably provided between each two successive process containers 8 in order to prevent treatment fluid from drying on between successive process steps. Furthermore, an initial preliminary cleaning of the substrates can be achieved by the wetting thereof so that a carrying of the treatment fluid from one process container to the next is prevented. Since the different treatment fluids generally have different densities, the level of the treatment fluid is respectively set by means of the slide unit 44 in such a way that the pressure of the treatment fluid at the respective introduction and outlet openings 15, 16 does not cause the treatment fluid to flow out of the process container. In addition, by means of the vacuum device 37 an under pressure is generated in the air space located above the treatment fluid in order to further reduce the treatment fluid pressure that exists at the openings 5, 16. In this connection, all of the successively arranged process containers 8 are preferably connected to a single vacuum device, which produces a respectively uniform under pressure in the respective process containers or at the same height of the slide unit generates different underpressures. Pressure differences that result at the openings 15, 16 due to the different densities of the treatment fluids are compensated for by means of the slide unit 4 and hence by the level of the treatment fluid of the process containers, so that no treatment fluid escapes from the process containers 8 via the openings 15, 16.

During the treatment of the wafers 3, treatment fluid 20 is first introduced via the diffuser plate 22 into the process container 8 until this fluid flows over the overflow edge 45 of the slide unit 44 into the overflow container 42. Treatment fluid is continuously introduced into the process container 8 via the diffuser plate 22, so that a homogeneously upwardly directed flow results within the process container. Subsequently, by means of the introduction opening 15 a wafer 3 is pushed into the process container 8 and is pushed partially therethrough. In so doing, the front and back sides of the wafer 3 are acted upon by the ultrasonic units 24, 26. The wafers 3 are guided within the process container 8 by the lateral guides 18. When a front end of the wafer 3 is guided through the process container 8, the thereby resulting meniscus between the treatment fluid 20 and the wafer 3 is acted upon by a fluid that reduces the surface tension of the treatment fluid 20, as a result of which the wafer 3 is dried during the removal from the treatment fluid 20. The guiding end of the wafer 3 is taken up by the transport unit 10 and is pulled completely through the process container 8 and, as the case may be, is transported to a following process container 8.

Although the invention has been described with the aid of one preferred embodiment, it should be noted that the invention is not to limited to this embodiment. For example, the features of the drying chamber 32 are not necessary with process containers 8 that are followed by a further process container. Furthermore, the precise configuration of the ultrasonic unit is not mandatory, since depending upon the substrate that is to be treated, for example a single ultrasonic unit is sufficient for the treatment of a substrate surface. A diffuser plate 22 is also not absolutely necessary, and in place thereof, or in combination with the diffuser plate, a funnel-shaped base having an inlet opening could be provided. The vacuum device 37 is also not absolutely necessary, since the pressure that exists at the openings 15, 16 can also be regulated by other means, such as, for example, a capillary device. The pressure that is necessary in this connection is regulated by the movable slide unit 44.

The respective features of the treatment apparatus 1 can be used in combination with one another or respectively also individually, i.e. independently of one another.

The specification incorporates by reference the disclosure of German priority document 199 34 300.4 filed 21 Jul. 1999 and International priority document PCT/EP00/06716 of Jul. 14, 2000.

The present invention is, of course, in no way restricted to the specific disclosure of the specification and drawings, but also encompasses any modifications within the scope of the appended claims.

What is claimed is:

1. An apparatus for treating substrates, comprising:
   at least one essentially closed process container, which is disposed is a gas atmosphere, contains a treatment fluid and has at least two continuously open openings for a linear guidance of substrates through said at least one process container;
   an essentially closed overflow container that is mounted on said at least one process container and has an overflow means disposed above said openings of said at least one process container;
   an inlet means for treatment fluid, wherein said inlet means is disposed below said openings of said at least one process container; and
   a device for generating an under pressure in said at least one process container.

2. An apparatus according to claim 1, wherein a height of said overflow means is adjustable.

3. An apparatus according to claim 1, wherein an essentially horizontally disposed diffuser plate is provided in said at least one process container.

4. An apparatus according to claim 1, wherein a collecting trough is mounted on an outer periphery of said at least one process container below at least one of said openings thereof.

5. An apparatus according to claim 4, wherein a drip catcher is disposed in said collecting trough.

6. An apparatus according to claim 1, wherein at least one ultrasonic unit is provided within said at least one process container.

7. An apparatus according to claim 6, wherein said at least one ultrasonic unit extends over the entire width of said at least one process container.

8. An apparatus according to claim 6, wherein said at least one ultrasonic unit s beveled on a rear side thereof in order to provide an aerodynamic shape.

9. An apparatus according to claim 6, wherein at least two ultrasonic units are provided that face one another, and wherein at least one respective ultrasonic unit is disposed above and below a level of said openings respectively so that a substrate is movable between said ultrasonic units.

10. An apparatus according to claim 1, wherein a drying chamber is provided that surrounds an outlet opening of said at least one process container, and wherein said drying chamber is provided with a device for introducing a fluid that reduces a surface tension of said treatment fluid.

11. An apparatus according to claim 1, wherein a plurality of process containers are disposed one after another.

12. An apparatus according to claim 11, wherein means are provided for introducing different treatment fluids into said process containers.

13. An apparatus according to claim 11, wherein a respective wetting unit is disposed between each two process containers.

* * * * *

UNITED STATES PATENT AND TRADEMARK OFFICE
CERTIFICATE OF CORRECTION

PATENT NO. : 6,799,588 B1 Page 1 of 1
APPLICATION NO. : 10/031923
DATED : October 5, 2004
INVENTOR(S) : Speh et al.

It is certified that error appears in the above-identified patent and that said Letters Patent is hereby corrected as shown below:

On The Title Page,
Item [73] should read as follows:

[73] Assignees: STEAG Microtech GmbH (Germany) and
IMEC (Belgium)

Signed and Sealed this

Nineteenth Day of June, 2007

JON W. DUDAS
*Director of the United States Patent and Trademark Office*